United States Patent
Ohashi et al.

(10) Patent No.: US 9,660,171 B2
(45) Date of Patent: May 23, 2017

(54) ELECTRONIC COMPONENT AND ACOUSTIC WAVE DEVICE

(75) Inventors: Yasutaka Ohashi, Shiga (JP); Masaki Nambu, Shiga (JP); Yusuke Morimoto, Shiga (JP); Daisuke Makibuchi, Shiga (JP); Takanori Ikuta, Shiga (JP)

(73) Assignee: KYOCERA CORPORATION, Kyoto (JP)

( * ) Notice: Subject to any disclaimer, the term of this patent is extended or adjusted under 35 U.S.C. 154(b) by 417 days.

(21) Appl. No.: 14/112,208

(22) PCT Filed: Apr. 9, 2012

(86) PCT No.: PCT/JP2012/059721
§ 371 (c)(1),
(2), (4) Date: Oct. 16, 2013

(87) PCT Pub. No.: WO2012/144370
PCT Pub. Date: Oct. 26, 2012

(65) Prior Publication Data
US 2014/0042870 A1 Feb. 13, 2014

(30) Foreign Application Priority Data

Apr. 19, 2011 (JP) .............................. 2011-093024
Jul. 29, 2011 (JP) .............................. 2011-166453

(51) Int. Cl.
*H01L 41/053* (2006.01)
*H01L 41/047* (2006.01)
(Continued)

(52) U.S. Cl.
CPC .......... *H01L 41/047* (2013.01); *H01L 41/053* (2013.01); *H03H 3/08* (2013.01);
(Continued)

(58) Field of Classification Search
CPC ..................................................... H01L 41/053
(Continued)

(56) References Cited

U.S. PATENT DOCUMENTS 6,310,421 B2 * 10/2001 Morishima ............... 310/313 R
2006/0131998 A1 * 6/2006 Aoki ........................ H03H 3/08
310/340

(Continued)

FOREIGN PATENT DOCUMENTS

JP   2001185976 A   7/2001
JP   2006217226 A   8/2006
(Continued)

OTHER PUBLICATIONS

International Search Report dated Jun. 26, 2012, issued for International Application No. PCT/JP2012/059721.

*Primary Examiner* — Derek Rosenau
(74) *Attorney, Agent, or Firm* — Procopio Cory Hargreaves and Savitch LLP

(57) ABSTRACT

An electronic component has a mounting board, a bump located on a mounting surface of the mounting board, a SAW device located on the bump and connected to the bump. The SAW device has an element substrate, an excitation electrode located on the first primary surface of the element substrate, a pad located on the first primary surface and connected to the excitation electrode, and a cover located above the excitation electrode and formed with a pad exposure portion on the pad. Further, the SAW device makes the top surface of the cover face the mounting surface, makes the bump be located in the pad exposure portion, and makes the pad abut against the bump.

16 Claims, 14 Drawing Sheets

(51) Int. Cl.
*H03H 3/08* (2006.01)
*H03H 9/05* (2006.01)
*H03H 9/10* (2006.01)

(52) U.S. Cl.
CPC .......... *H03H 9/059* (2013.01); *H03H 9/1085* (2013.01); *H03H 9/1092* (2013.01); *H01L 2224/16225* (2013.01); *H01L 2224/32225* (2013.01); *H01L 2224/73204* (2013.01); *H01L 2224/81* (2013.01)

(58) Field of Classification Search
USPC .............................. 310/313 R, 340, 348, 365
See application file for complete search history.

(56) References Cited

U.S. PATENT DOCUMENTS

| | | |
|---|---|---|
| 2006/0138902 A1 | 6/2006 | Kando |
| 2010/0052473 A1 | 3/2010 | Kimura et al. |
| 2010/0225202 A1 | 9/2010 | Fukano et al. |
| 2011/0012695 A1 | 1/2011 | Yamaji et al. |
| 2011/0084573 A1* | 4/2011 | Yamaji ................. H03H 9/1092 310/340 |

FOREIGN PATENT DOCUMENTS

| | | |
|---|---|---|
| JP | 2009105528 A | 5/2009 |
| JP | 2009183008 A | 8/2009 |
| JP | 2009225476 A | 10/2009 |
| JP | 201056671 A | 3/2010 |
| JP | 201123930 A | 2/2011 |
| WO | 2009057699 A1 | 5/2009 |
| WO | 2010061821 A1 | 6/2010 |

\* cited by examiner

501

601

ELECTRONIC COMPONENT AND ACOUSTIC WAVE DEVICE

TECHNICAL FIELD

The present invention relates to an acoustic wave device such as a surface acoustic wave (SAW) device and an electronic component having the acoustic wave device.

BACKGROUND ART

Known in the art is an acoustic wave device which has an element substrate, an excitation electrode which is located on the element substrate, a resinous cover which covers the excitation electrode, and solder bumps which are electrically connected to the excitation electrode and are provided on an top surface or the like of the cover. Such an acoustic wave device is mounted on a mounting board by being arranged with an top surface of the cover made to face a mounting surface of the mounting board, making the solder bumps abut against pads which are arranged on the mounting surface of the mounting board, and heating in that state. Further, the mounted acoustic wave device is covered by a mold resin to be sealed.

In Patent Literature 1, the cover of the acoustic wave device is formed with openings which penetrate from the bottom surface (the surface on the element substrate side) to the top surface. The openings are filled entirely with solder. The filled solder is melted once and resolidified before mounting of the acoustic wave device on the mounting board, whereby the portions at the cover top surface side are rounded by surface tension and form spherical bumps. The bumps are separated from the inner circumferential surfaces of the openings in the process of forming the spherical shapes and stick out from the top surface of the cover. However, when the bumps are heated and the acoustic wave device is mounted on the mounting board, the bumps return from the spherical shapes to the shapes filled in the openings and the top surface of the cover contacts the mounting surface of the mounting board. As a result, in Patent Literature 1, it is considered that the lid body becomes resistant to pressure of the mold resin, and the bumps are surrounded by the cover, so the reliability becomes higher.

In Patent Literature 2, the cover of the acoustic wave device is formed with openings which penetrate from the bottom surface to the top surface. The openings are filled with metal up to positions somewhat lower than the top surface of the cover, whereby columnar terminals are formed. Solder bumps are formed on the terminals and bury the upper ends of the openings.

In Patent Literatures 1 and 2, the solder bumps are filled in the openings of the cover at the stage where at least the acoustic wave device is mounted on the mounting board. Accordingly, the solder bumps change to the shapes of the openings of the cover. As a result, for example, the solder bumps are formed to shapes where stress easily concentrates at positions which contact edge portions which are formed by the inner circumferential surfaces of the openings and the top surface of the cover and the solder bumps easily crack. That is, the degree of freedom in the shapes of the bumps is restricted by the shapes of the openings of the cover, therefore various inconveniences arise.

Accordingly, it is desired to provide an acoustic wave device which is capable of improving the degree of freedom in the shapes of the bumps and an electronic component which has the acoustic wave device.

CITATIONS LIST

Patent Literature

Patent Literature 1: Japanese Patent Publication No. 2006-217226A
Patent Literature 2: Japanese Patent Publication No. 2010-56671A

SUMMARY OF INVENTION

An electronic component according to one aspect of the present invention has a mounting board, a bump which is located on a mounting surface of the mounting board, and an acoustic wave device which is located on the bump and is connected to the bump. The acoustic wave device has an element substrate, an excitation electrode which is located on a primary surface of the element substrate, a pad which is located on the primary surface and is connected to the excitation electrode, and a cover which is located above the excitation electrode and which is formed with pad exposure portion exposing the pad and comprised of a hole portion or a cut away portion or a combination of the same. The top surface of the cover is made to face the mounting surface, the bump is located in the pad exposure portion, and the pad is contacted to the bump.

An acoustic wave device according to one aspect of the present invention has an element substrate, an excitation electrode which is located on a primary surface of the element substrate, a pad which is located on the primary surface and is connected to the excitation electrode, and a cover which is located on the excitation electrode and which is formed with pad exposure portion exposing the pad and comprised of a hole portion or a cut away portion or a combination of the same. The pad exposure portion is communicated with the outside of the side surface of the cover at the top surface side portion of the cover.

An acoustic wave device according to one aspect of the present invention has an element substrate, an excitation electrode which is located on a primary surface of the element substrate, a plurality of pads which are located on the primary surface and are connected to the excitation electrode, and a cover which is located above the excitation electrode and is formed with pad exposure portions exposing the plurality of pads and comprised of hole portions or cut away portions or combinations of the same. At least portion of the plurality of pad exposure portions are connected with each other at the top surface side portion of the cover.

According to the above configurations, the degree of freedom of the shape of the bumps can be improved.

DESCRIPTION OF EMBODIMENTS

Below, SAW devices according to embodiments of the present invention are explained with reference to the drawings. Note that, the drawings used in the following explanation are schematic ones. Dimensions, ratios, etc. on the drawings do not always match actual ones.

In the second and following embodiments, portions of the configurations which are common with or similar to the already explained embodiments are sometimes assigned notations which are common with those in the already explained embodiments and illustrations and explanations are sometimes omitted.

<First Embodiment>
(Configurations of SAW Device Etc.)

Figure 1:
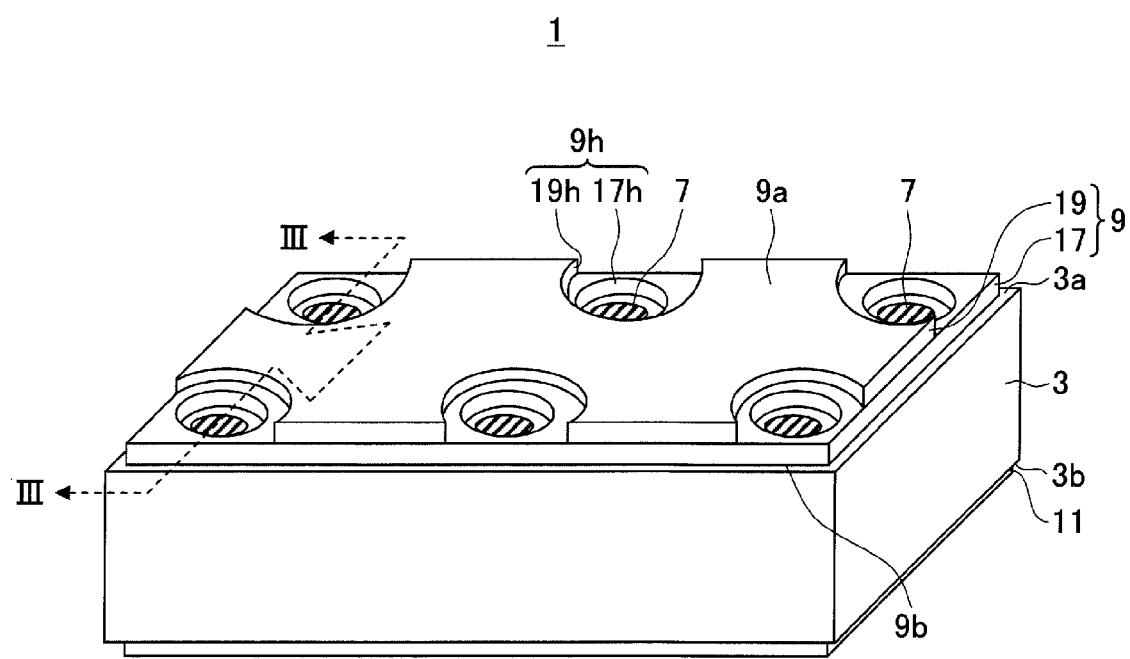
FIG. 1 A perspective view of an appearance of a SAW device according to a first embodiment of the present invention.
Figure 1:
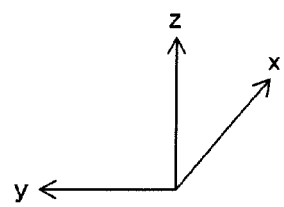
Figure 2:
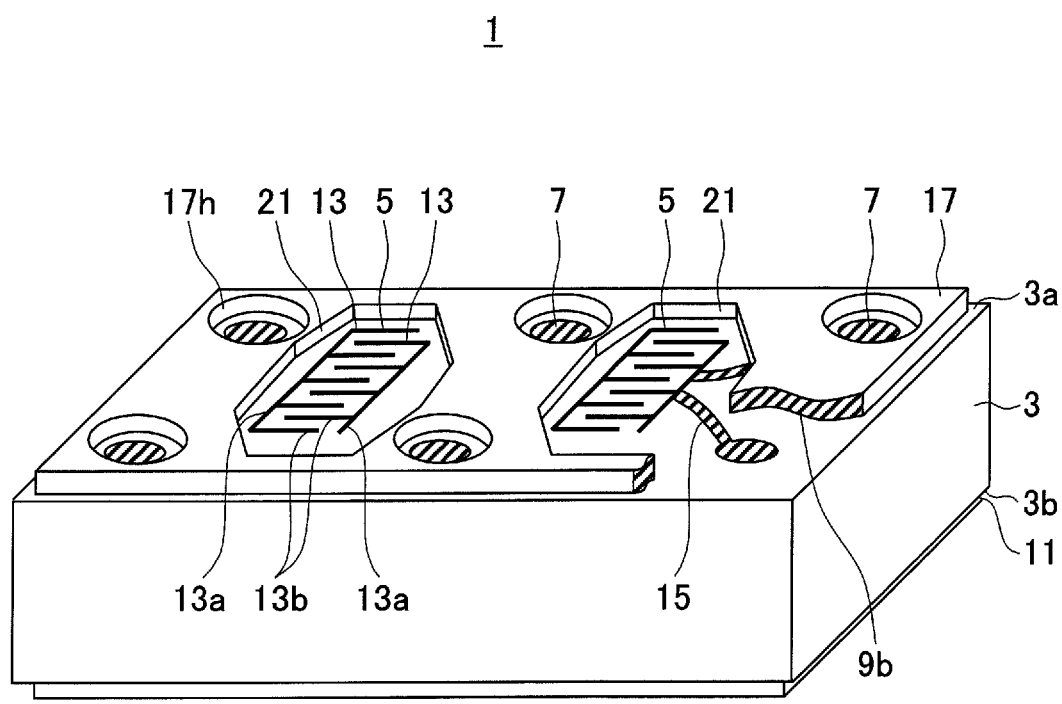
FIG. 2 A perspective view which shows the SAW device in FIG. 1 partially cut away.

FIG. 1 is a perspective view of an appearance of a SAW device 1 according to a first embodiment of the present invention. Further, FIG. 2 is a perspective view which shows the SAW device 1 partially cut away.

Note that, in the SAW element 1, any direction may be made considered upward or downward. However, in the following embodiments, for convenience, a Cartesian coordinate system xyz is defined, and use is made of a "top surface", "bottom surface", and other terms where the positive side of the z-direction (the upward side on the drawing sheet in FIG. 1) is made the upper part.

The SAW device 1 is configured by a so-called wafer level package (WLP) type SAW device. The SAW device 1 has an element substrate 3, excitation electrodes 5 (FIG. 2) which are provided on a first primary surface 3a of the element substrate 3, pads 7 which are provided on the first primary surface 3a and are connected to the excitation electrodes 5, a cover 9 (FIG. 1) which covers the excitation electrodes 5 and exposes the pads 7, and a back surface portion 11 which is provided on a second primary surface 3b of the element substrate 3.

The SAW device 1 receives as input signals through any of the plurality of pads 7. The input signals are filtered by the excitation electrodes 5 etc. Further, the SAW device 1 outputs the filtered signals through any of the plurality of pads 7. The concrete configurations of the members are as follows.

The element substrate 3 is configured by a piezoelectric substrate. Specifically, for example, the element substrate 3 is configured by a substrate of single crystal which has piezoelectricity such as a lithium tantalate single crystal or a lithium niobate single crystal. The element substrate 3 is formed in for example block shape and has rectangular, mutually parallel and flat first primary surface 3a and second primary surface 3b. The size of the element substrate 3 may be suitably set. For example, the thickness (z-direction) is 0.2 mm to 0.5 mm, and the length of one side (x-direction or y-direction) is 0.5 mm to 3 mm.

The excitation electrodes 5 (FIG. 2) are formed on the first primary surface 3a in a layer state (sheet state). Each excitation electrode 5 is a so-called IDT (interdigital transducer) and has a pair of comb-shaped electrodes 13. Each comb-shaped electrode 13 has a bus bar 13a extending in a propagation direction of the surface acoustic wave (x-direction in the present embodiment) on the element substrate 3 and a plurality of electrode fingers 13b which extend from the bus bar 13a in a direction perpendicular to the propagation direction (y-direction in the present embodiment). The two comb-shaped electrodes 13 are provided so that their plurality of electrode fingers 13b mesh (intersect) with each other.

Note that, FIG. 2 etc. are schematic views, therefore two pairs of comb-shaped electrodes 13 each having a few electrode fingers 13b are shown. In actuality, a plurality of pairs of comb-shaped electrodes each having a larger number of electrode fingers than this may be provided. Further, a ladder type SAW filter in which a plurality of excitation electrodes 5 are connected by serial connection, parallel connection, or another method may be configured or a dual mode SAW resonator filter in which a plurality of excitation electrodes 5 are arranged along the x-direction may be configured.

The pads 7 are formed on the first primary surface 3a in a layer state. The planar shapes of the pads 7 may be suitably set. Further, preferably, in the present embodiment, the planar shapes of the pads 7 are circular. The number and positions of arrangement of the pads 7 are suitably set in accordance with the configuration etc. of the filter which is configured by the excitation electrodes 5. In the present embodiment, a case where six pads 7 are arranged along the periphery of the first primary surface 3a is exemplified.

The excitation electrodes 5 and the pads 7 are connected by lines 15 (FIG. 2). The lines 15 are formed on the first primary surface 3a in a layer state and connect the bus bars 13a of the excitation electrodes 5 and the pads 7. Note that, the lines 15 may have not only portions formed on the first primary surface 3a, but also portions which three-dimensionally intersect with respect to the former portions with insulators interposed therebetween.

The excitation electrodes 5, the pads 7, and (the portions formed on the first primary surface 3a of) the lines 15 are configured by conductive materials which are the same as each other. The conductive material is for example an Al alloy such as an Al—Cu alloy. Further, the excitation electrodes 5, pads 7, and lines 15 are formed to for example thicknesses which are the same as each other. These thicknesses are for example 100 to 500 nm. Further, when the lines 15 are made to three-dimensionally intersect with each other, the lines 15 on the first primary surface 3a side are formed by for example an Al—Cu alloy, and the lines 15 which is arranged above the former through an insulator are formed by lines of multi-layer structures made of Cr/Ni/Au or Cr/Al in order from the bottom. Note that, when the upper side lines in the three-dimensional lines are formed by Cr/Ni/Au, since adhesion between the Au of the uppermost layer and the resin is relatively weak, the cover 9 made of resin should not be laminated on these three-dimensional lines. Due to this, peeling of the cover 9 can be suppressed. On the other hand, when the upper side lines in the three-dimensional lines are formed by Cr/Al, the cover 9 may be laminated on the three-dimensional lines as well.

Figure 3:
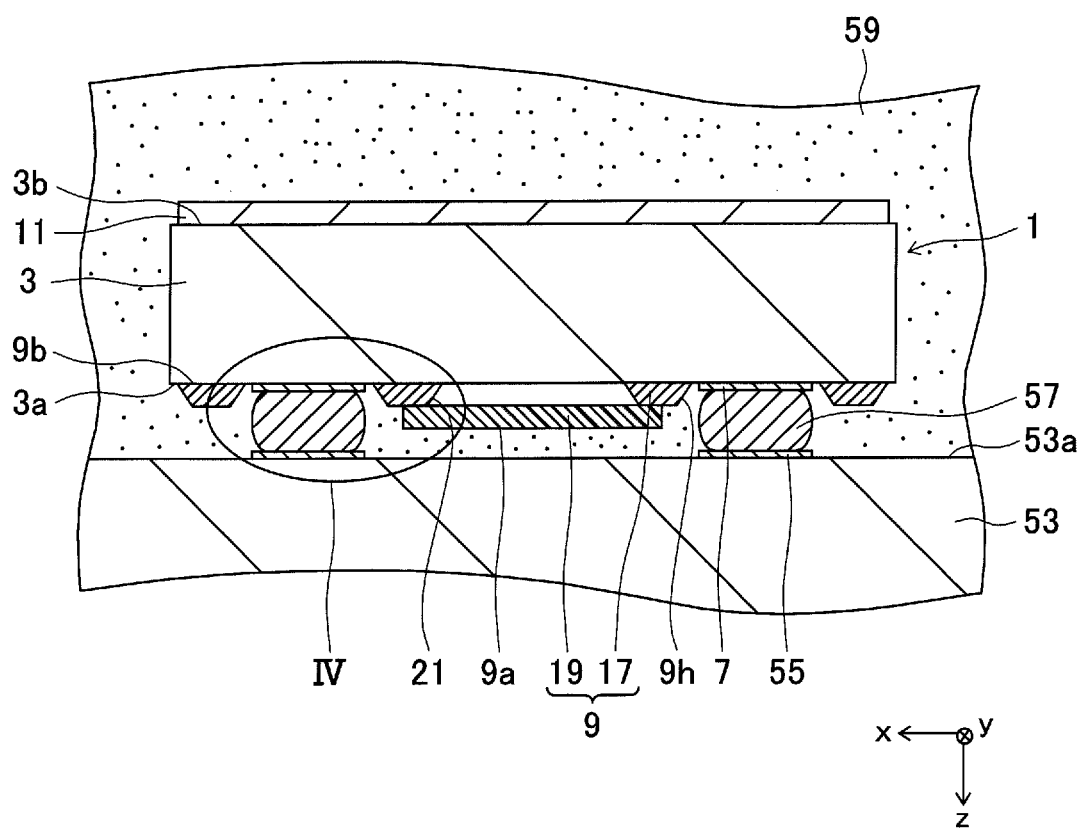
FIG. 3 A cross-sectional view which shows a portion of an electronic component in which the SAW device in FIG. 1 is mounted.

Note that, in addition to the layers which are made of the same material and have the same thickness as the excitation electrodes 5, the pads 7 may have connection reinforcing layers as well for the purpose of raising the connectivity with the bumps (see FIG. 3). For example, the pads 7 may have layers of nickel which are superimposed on the layers of Al—Cu alloy and layers of gold which are superimposed on the layers of nickel as well.

The cover 9 (FIG. 1) is for example formed with an outer side shape of a layer state having a constant thickness and roughly covering the first primary surface 3a as a whole. That is, in the present embodiment, corresponding to the first primary surface 3a being rectangular, the outer side shape of the cover 9 is roughly formed in a thin block shape. Further, the cover 9 has a top surface 9a which is roughly parallel with respect to the first primary surface 3a and is flat.

The cover 9 has a frame section 17 (first layer, FIG. 1 and FIG. 2) which is provided on the first primary surface 3a and which surrounds the excitation electrodes 5 in a plan view of the first primary surface 3a, and a lid section 19 (second layer, FIG. 1) which is superimposed on the frame section 17 and which closes openings of the frame section 17. Further, a space which surrounded by the first primary surface 3a (strictly speaking, a protective layer 25 which is explained later), frame section 17, and lid section 19 forms a vibration space 21 (FIG. 2) which facilitates the vibration of the excitation electrodes 5.

The planar shape of the vibration space 21 may be suitably set. However, the present embodiment exemplifies a case where it is formed roughly in an octagonal shape so that the pads 7 which are located on the four corner sides of the vibration space 21 can be avoided while a broad area of vibration space 21 can be secured. Note that, it can be grasped that the cover 9 has a shape such that a concave portion configuring the vibration space 21 is formed on the bottom surface 9b side.

The frame section 17 is configured by forming one or more openings (two in the present embodiment) which become the vibration space 21 in a layer having a roughly constant thickness. The thickness of the frame section 17 (height of the vibration space 21) is for example several μm to 30 μm. The lid section 19 is configured by a layer having a roughly constant thickness. The thickness of the lid section 19 is for example several μm to 30 μm.

The frame section 17 and the lid section 19 may be formed by the same material or may be formed by materials different from each other. In the present application, for convenience of explanation, a borderline between the frame section 17 and the lid section 19 is clearly shown. However, in an actual product, the frame section 17 and the lid section 19 may be integrally formed by the same material as well.

The cover 9 (frame section 17 and lid section 19) is formed by a photosensitive resin. The photosensitive resin is for example a urethane acrylate, polyester acrylate, or epoxy acrylate resin which is cured by radical polymerization of acryl groups, methacryl groups, or the like. Other than these, a polyimide resin etc. may be used as well.

In the cover 9, further, pad exposure portions 9h (FIG. 1) for exposing the pads 7 are formed. Each pad exposure portion 9h is configured by a first pad exposure portion 17h which is formed in the frame section 17 and a second pad exposure portion 19h (FIG. 1) which is formed in the lid section 19.

Each first pad exposure portion 17h in the present embodiment is a hole portion which penetrates through the frame section 17 in its thickness direction and is opened at the bottom surface 9b of the cover 9. Further, the first pad exposure portion 17h is located on the pad 7. In a plan view, the shape of the first pad exposure portion 17h and its relative size relative to a pad 7 may be suitably set. Preferably, in the present embodiment, in a plan view, the first pad exposure portion 17h has a circular shape which has a broader in diameter (area) than the pad 7 and has an inner circumferential surface which is located on the outer side from the outer edge of the pad 7. Further, the first pad exposure portion 17h is formed in a circular shape which is concentric with the pad 6. The distance between the outer edge of the pad 7 and the first pad exposure portion 17h is constant over the entire circumference of the first pad exposure portion 17h.

Each second pad exposure portion 19h is a cut away portion which is communicated with the outside of a side surface of the lid section 19. Further, the second pad exposure portion 19h is located on a first pad exposure portion 17h. The planar shape of the second pad exposure portion 19h and its relative size relative to the first pad exposure portion 17h may be suitably set. Preferably, in the present embodiment, in a plan view, the second pad exposure portion 19h includes a circular or fan shape having a larger diameter (area) than the first pad exposure portion 17h and has an inner surface which is located on the outer side from the inner circumferential surface of the first pad exposure portion 17h. Further, the second pad exposure portion 19h is formed in a circular shape which is concentric with the first pad exposure portion 17h. The distance between the inner circumferential surface of the first pad exposure portion 17h and the second pad exposure portion 19h is constant over the entire circumference of the second pad exposure portion 19h.

Note that, as will be understood from the explanation of the diameters (areas) of the first pad exposure portions 17h and second pad exposure portions 19h, preferably, in a pad exposure portion 9h, the portion on the top surface 9a side of the cover 9 is formed larger in diameter (area) than the portion on the bottom surface 9b side of the cover 9.

Each second pad exposure portion 19h is communicated with the outside of a side surface of the cover 9 by for example being formed in a circular shape and the distance between the center of that circular shape and the side surface of the cover 9 being made shorter than the radius, or by being formed in a shape that extends to the outside of the side surface of the cover 9. Note that, the first pad exposure portion 17h may be formed not by a hole portion, but by a cut away portion in the same way as the second pad exposure portion 19h.

Although not particularly shown, the back surface portion 11 has for example a back surface electrode which covers roughly the entire surface of the second primary surface 3b of the element substrate 3 and an insulating protective layer which covers the back surface electrode. By the back surface electrode, an electric charge which is charged on the surface of the element substrate 3 due to a temperature change or the like is discharged. Due to the protective layer, damage of the element substrate 3 is suppressed. Note that, in the following description, the back surface portion 11 is sometimes omitted in illustration and explanation.

FIG. 3 is a cross-sectional view which shows a portion of an electronic component 51 in which the SAW device 1 is mounted and corresponds to the line III-III in FIG. 1.

The electronic component 51 has a mounting board 53, pads 55 which are provided on a mounting surface 53a of the mounting board 53, bumps 57 which are arranged on the pads 55, a SAW device 1 which is mounted on the mounting surface 53a through the bumps 57, and a mold resin 59 which seals the SAW device 1.

Note that, other than this, the electronic component 51 for example has an IC which is mounted on the mounting board 53, is connected through the mounting board 53 to the SAW device 1, and is sealed together with the SAW device 1 by the mold resin 59 etc. By this, a module is configured.

The mounting board 53 is configured by for example a printed circuit board together with the pads 55 or together with the pads 55 and bumps 57. The printed circuit board may be a rigid board or a flexible board. Further, the printed circuit board may be a single-layer board, may be a two-layer board, or may be a multilayer board. Further, the base material, insulating material, and conductive material of the printed circuit board may be selected from among suitable materials.

The bumps 57 are put in the pad exposure portions 9h of the cover 9 and abut against the pads 7 of the SAW device 1. The bumps 57 are formed by a metal which is melted by heating and is bonded to the pads 7. The bumps 57 are configured by for example solder. The solder may be a solder using lead such as a Pb—Sn alloy solder or may be a lead-free solder such as Au—Sn alloy solder, Au—Ge alloy solder, Sn—Ag alloy solder, or Sn—Cu alloy solder.

The mold resin 59 contains for example an epoxy resin, curing material, and filler as principal component. The mold resin 59 not only covers the SAW device 1 from the back surface portion 11 side and lateral sides, but also is filled between the SAW device 1 and the mounting board 53. Specifically, the mold resin 59 is filled between the top surface 9a of the cover 9 and the mounting surface 53a of the mounting board 53 and between the inner circumferential surfaces of the pad exposure portions 9h and the bumps 57.

Figure 4:
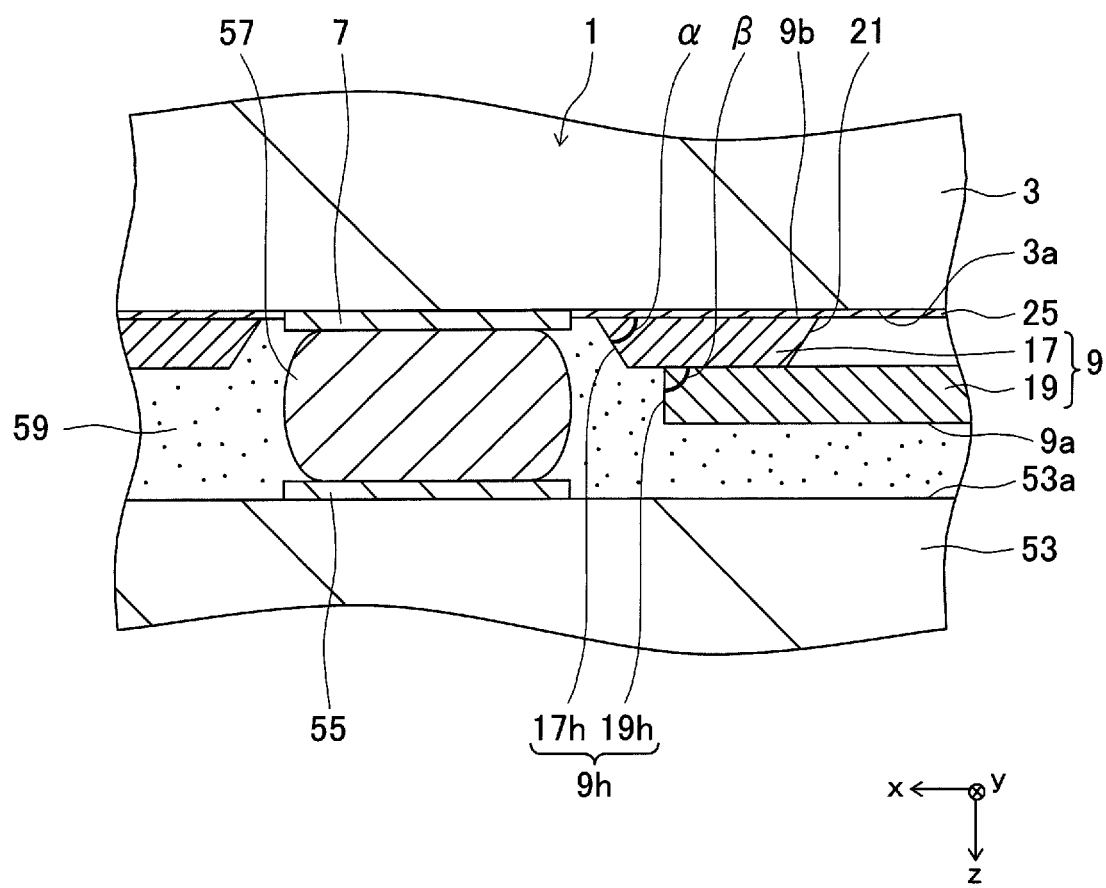
FIG. 4 An enlarged view of a region IV in FIG. 3.

FIG. 4 is an enlarged view of a region IV in FIG. 3.

On the first primary surface 3a of the element substrate 3, a protective layer 25 is superimposed. The cover 9 is superimposed on the protective layer 25. The protective layer 25 covers the excitation electrodes 5 (see FIG. 5B etc.) and contributes to prevention of oxidation etc. of the excitation electrodes 5. The protective layer 25 is formed by for example silicon oxide (SiO2 etc.), aluminum oxide, zinc oxide, titanium oxide, silicon nitride, or silicon. The thickness of the protective layer 25 is for example about ⅟10 of the thickness of the excitation electrodes 5 (10 to 30 nm) or thicker than the excitation electrodes 5 such as 200 nm to 1500 nm.

The pads 7 are exposed from the protective layer 25. Note that, in FIG. 4, the openings of the protective layer 25 for exposing the pads 7 are given the same shapes and areas as those of the pads 7, but the openings may be larger than the pads 7 or may be smaller than the pads (the portions around the openings of the protective layer 25 may cover the peripheries of the pads 7).

The bumps 57 are given roughly shapes of spheres which are crushed by the pads 7 and the pads 55. That is, the bumps 57 have two flat surfaces in contact with the pads 7 and 55 and an outer circumferential surface connecting the two flat surfaces. Those two flat surfaces and outer circumferential surfaces are circular in a plan view. The outer circumferential surfaces have center sides which stick out outward to form curved shapes in a side view.

The areas of the flat surfaces of the bumps 57 which contact the pads 7 and 55 are preferably the same as or smaller than the areas of the pads 7 and 55.

The inner surfaces of the pad exposure portions 9h do not contact the bumps 57 over their entireties. Accordingly, clearances between the inner surfaces of the pad exposure portions 9h and the bumps 57 are formed from the top surface 9a to the bottom surface 9b of the cover 9 and are filled with the mold resin 59.

The inner circumferential surfaces of the first pad exposure portions 17h are configured by inclined surfaces (tapered surfaces) inclined in a direction such that the first pad exposure portions 17h become broader the closer to the top surface 9a side of the cover 9. The angle α of the inclined surface relative to the first primary surface 3a is for example about 80°. In the first pad exposure portion 17h, preferably, in the portion opened at the bottom surface 9b of the cover 9 (in other words, the portion having the smallest area), the area is larger than that of the pad 7. For example, in a case where the diameter of the pad 7 is 60 μm or more, but less than 125 μm, the diameter of the first pad exposure portion 17h in the bottom surface 9b is 100 μm or more, but not more than 250 μm.

In the same way as the first pad exposure portion 17h, the inner surfaces of the second pad exposure portions 19h is configured by inclined surfaces (tapered surfaces) inclined in a direction such that the second pad exposure portions 19h become broader the closer to the top surface 9a side of the cover 9 to thereby form. The angle β of the inclined surface relative to the first primary surface 3a may be the same as, or larger or smaller than, the angle α in the first pad exposure portion 17h. Note that, in FIG. 4, a case where the angle β is larger than the angle α is exemplified. In the bottom surface portion on the first pad exposure portion 17h side (in other words, the portion having the smallest area), the second pad exposure portion 19h has a larger area than that of the portion of the first pad exposure portion 17h which is opened on the second pad exposure portion 19h side (in other words, the portion of the first pad exposure portion 17h having the largest area). For example, the difference of those diameters is several μm or more, but not more than several tens of μm.

Note that, the inner surfaces of the first pad exposure portions 17h and second pad exposure portions 19h are linear shapes in a side view in FIG. 4. However, in actuality, the edge portions may be rounded at the end portions or the shapes may be curved as a whole.

(Method of Production of SAW Device Etc.)

FIG. 5A to FIG. 6C are cross-sectional views (corresponding to the line III-III in FIG. 1) for explaining a method of production of the SAW device 1 and electronic component 51. The manufacturing steps advance from FIG. 5A to FIG. 6C in that order.

The manufacturing steps of FIG. 5A to FIG. 6A corresponding to the method of production of the SAW device 1 are realized in a so-called wafer process. That is, a mother substrate which is later divided to form individual element substrates 3 is formed with a thin film, processed by photolithography, etc. After that, it is diced whereby a large number of SAW devices 1 are formed in parallel. Note, in FIG. 5A to FIG. 6A, only a portion corresponding to one SAW device 1 is shown. Further, the conductive layer and insulation layer change in shapes along with the advance of the process. However, common notations are sometimes used before and after the change.

Figure 5A:
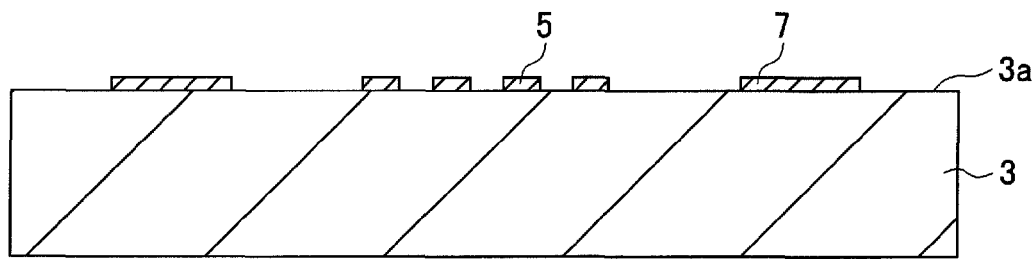
FIG. 5A to FIG. 5D are cross-sectional views for explaining a method of production of the electronic component in FIG. 2.

As shown in FIG. 5A, first, on the first primary surface 3a of the element substrate 3, excitation electrodes 5, pads 7, and lines 15 (not shown in FIG. 5A) are formed. Specifically, first, a thin film forming method such as a sputtering process, vapor deposition process, or CVD (chemical vapor deposition) process is used to form a metal layer on the first primary surface 3a. Next, the metal layer is patterned by a photolithography method using a reduction projection exposure apparatus (stepper) and a RIE (reactive ion etching) apparatus or the like. By this patterning, the excitation electrodes 5, lines 15, and pads 7 are formed.

Figure 5B:
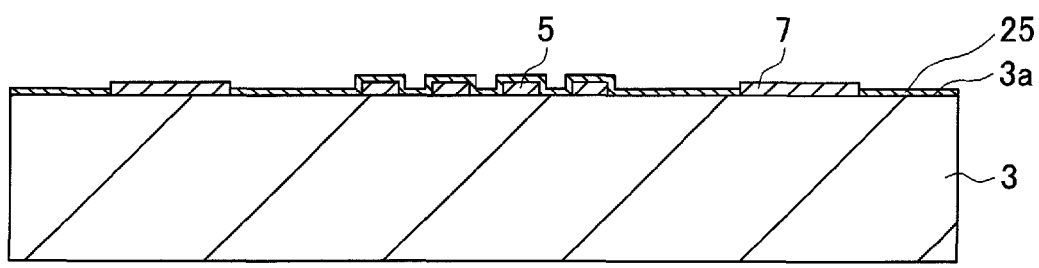

When the excitation electrodes 5 etc. are formed, as shown in FIG. 5B, the protective layer 25 is formed. Specifically, first, a thin film which becomes the protective layer 25 is formed by a suitable thin film forming method. The thin film forming method is for example the sputtering process or CVD. Next, portions of the thin film are removed by the photolithography method or the like so that the pads 7 are exposed. Due to this, the protective layer 25 is formed.

Figure 5C:
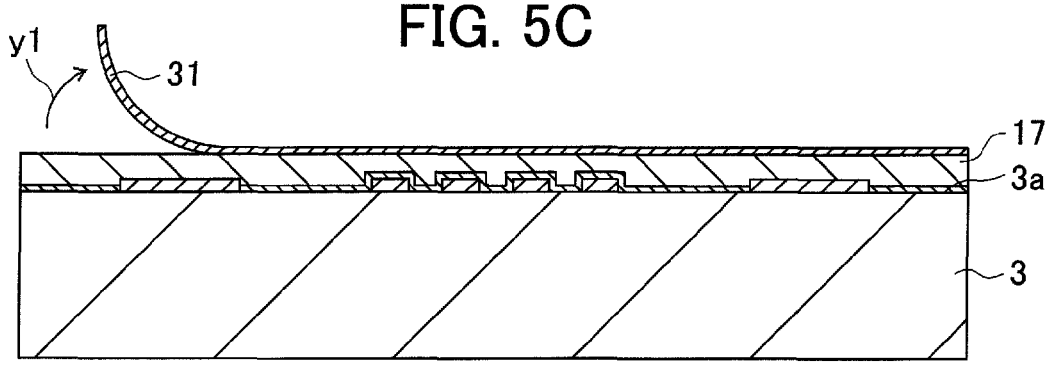

When the protective layer 25 is formed, as shown in FIG. 5C, a thin film which becomes the frame section 17 and is made of photosensitive resin is formed. The thin film is for example formed by adhesion of a film. The film has for example a base film 31 and a resin layer which is superimposed on the base film 31 and becomes the frame section 17. After adhering the resin layer to the protective layer 25, as indicated by an arrow y1, the base film 31 is peeled off. Note that, the thin film which becomes the frame section 17 may be formed by the same thin film-forming method as that for the protective layer 25 or may be formed by a spin coating method or the like other than the former.

Figure 5D:
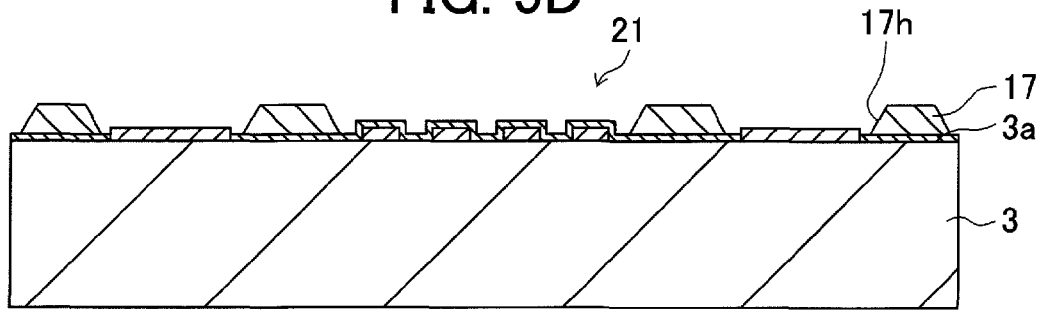

When the thin film which becomes the frame section 17 is formed, as shown in FIG. 5D, the photolithography method or the like is used to remove portions of the thin film and form openings configuring the vibration space 21 and first pad exposure portions 17h. Further, the thin film is removed with a constant width on the dicing lined as well. The frame section 17 is formed in this way. Note that, in the case where the thin film which becomes the frame section 17 is formed by adhesion of film, the process of peeling off the base film 31 may be carried out after the photolithography method as well.

Figure 6A:
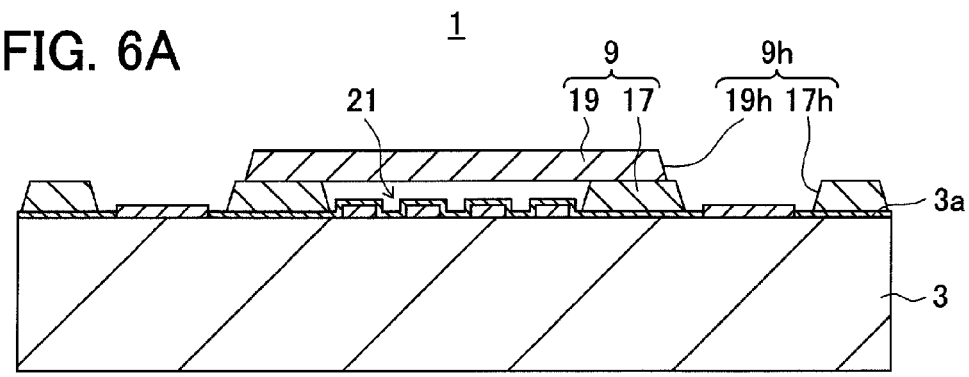
FIG. 6A to FIG. 6C are cross-sectional views which show the continuations of FIG. 5D.

When the frame section 17 is formed, as shown in FIG. 6A, the lid section 19 is formed. The method of forming the lid section 19 is the same as the method of formation of the frame section 17. Specifically, first, a thin film made of photosensitive resin which becomes the lid section 19 is formed. The thin film is formed by for example adhesion of film in the same way as the frame section 17. In the thin film, the photolithography method or the like is used to remove portions on the first pad exposure portions 17h and form the second pad exposure portions 19h. Further, the thin film is removed with a constant width on the dicing lines as well. By formation of the lid section 19, the vibration space 21 configured by the space surrounded by the protective layer 25, frame section 17, and lid section 19 is formed.

Figure 6B:
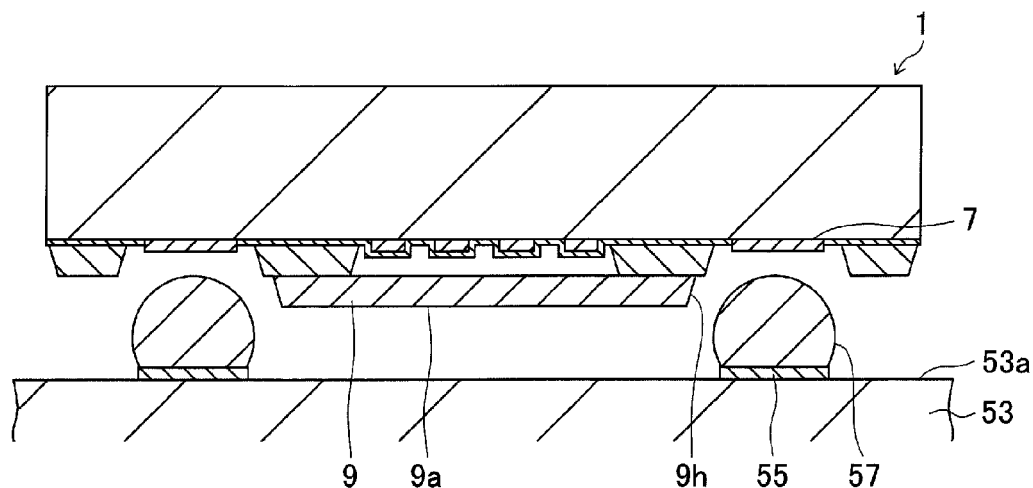

When the lid section 19 is formed, as shown in FIG. 6B and the following diagrams, the SAW device 1 is cut from the wafer and is mounted on the mounting board 53. As shown in FIG. 6B, before mounting the SAW device 1, the pads 55 and bumps 57 are provided on the mounting surface 53a of the mounting board 53. The bumps 57 are formed by for example the vapor deposition process, plating method, or printing process and are formed in roughly spherical shapes or semi-spherical shapes due to the influence of surface tension or the like.

Then, the SAW device 1 is arranged to make the top surface 9a of the cover 9 face the mounting surface 53a. The bumps 57 are put in the pad exposure portions 9h to abut against the pads 7 and support the SAW device 1. After that, the SAW device 1 and mounting board 53 are passed through a reflow furnace or the like and are temporarily heated, whereby the bumps 57 and the pads 7 are fixed to each other by melting and solidification of the bumps 57.

Figure 6C:
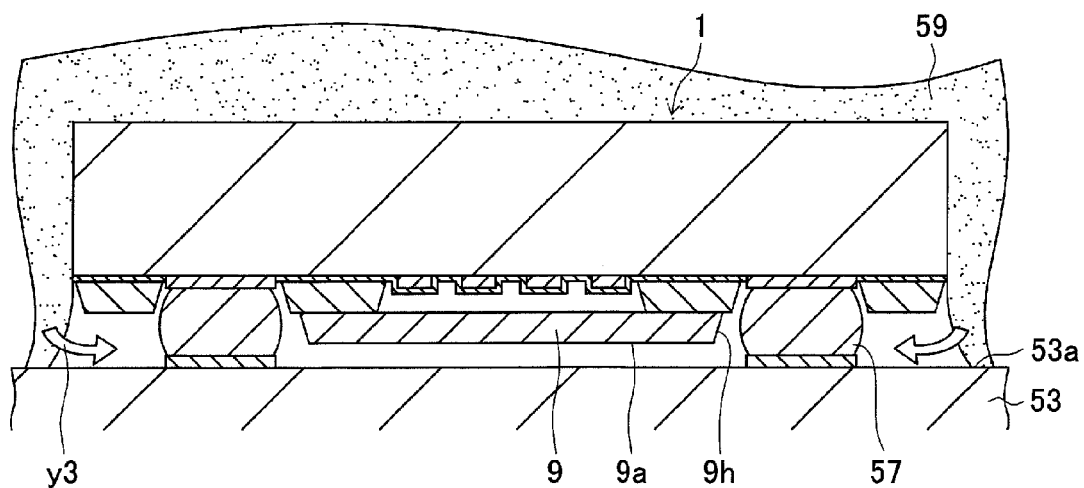

After that, as shown in FIG. 6C, the SAW device 1 is covered by the mold resin 59. The mold resin 59 is supplied to the periphery of the SAW device 1 by for example a transfer molding process or printing process. As indicated by an arrow y3, the mold resin 59 which is supplied to the periphery of the SAW device 1 flows into the gap between the top surface 9a of the cover 9 and the mounting surface 53a and further flows into the clearances between the inner circumferential surfaces of the pad exposure portions 9h and the bumps 57 by applied pressure. Then, as shown in FIG. 3, the electronic component 51 is manufactured.

According to the above embodiment, the electronic component 51 has a mounting board 53, bumps 57 which are located on the mounting surface 53a of the mounting board 53, a SAW device 1 which is located on the bumps 57 and is connected to the bumps 57, and a mold resin which covers the SAW device 1. The SAW device 1 has the element substrate 3, excitation electrodes 5 which are located on the first primary surface 3a of the element substrate 3, pads 7 which are located on the first primary surface 3a and are connected to the excitation electrodes 5, and a cover 9 which is located on the excitation electrodes 5 and has pad exposure portions 9h which are formed on the pads 7. Further, the SAW device 1 makes the top surface 9a of the cover 9 face the mounting surface 53a, makes the bumps 57 be located in the pad exposure portions 9h, and makes the pads 7 abut against the bumps 57. The mold resin 59 is filled between the top surface 9a of the cover 9 and the mounting surface 53a and between the bumps 57 and the inner surfaces of the pad exposure portions 9h.

Accordingly, the bumps 57 are shaped at least in part to not be influenced by the shapes of the pad exposure portions 9h of the cover 9. That is, the degree of freedom in the shapes of the bumps 57 is improved. This results in for example suppression of the formation of shapes where stress easily concentrates in the bumps 57 due to the edge portions formed by the inner circumferential surfaces of the pad exposure portions 9h and the top surface 9a or the step difference between the frame section 17 and the lid section 19 in the pad exposure portions 9h, so formation of cracks at the bumps 57 is suppressed. These effects particularly become conspicuous at the time when the mold resin 59 is filled between the bumps 57 and the inner surfaces of the pad exposure portions 9h from the top surface 9a up to the bottom surface 9b of the cover 9 as in the embodiment.

The inner surfaces of the pad exposure portions 9h have inclined surfaces (inner circumferential surfaces of the first pad exposure portions 17h or inner surfaces of the second pad exposure portions 19h) which are inclined in directions whereby the pad exposure portions 9h become broader the closer to the top surface 9a side of the cover 9 and which contact the mold resin 59.

Accordingly, for example, between the inclined surfaces and the bumps 57, flow of the mold resin 59 from the top surface 9a side of the cover 9 to its bottom surface 9b side becomes easier, so suppression of formation of voids in the mold resin 59 can be expected. By suppression of formation of voids, deformation etc. of the SAW device 1 due to expansion etc. of the voids is suppressed, so the reliability of the SAW device 1 is improved. Further, the bumps 57 have roughly spherical shapes having larger diameters than the thickness of the cover 9. Therefore, as exemplified in FIG. 4, the diameters tends to become larger on the top surface 9a side of the cover 9 compared with the pad 7 side. Accordingly, making the diameters of the pad exposure portions 9h smaller as a whole while securing the distance between the inner surfaces (inclined surfaces) of the pad exposure portions 9h and the bumps 57 can be expected to become easier. These effects particularly become conspicuous when the pad exposure portions 9h are broadened more the closer to the top surface 9a side of the cover 9, from the bottom surface 9b of the cover to the top surface 9a, as in this embodiment.

The pad exposure portions 9h has the first pad exposure portions 17h opened in the bottom surface 9b of the cover 9 and the second pad exposure portions 19h which are communicated with the first pad exposure portions 17h and are opened in the top surface 9a of the cover 9. The mold resin 59 is filled from the first pad exposure portions 17h up to the second pad exposure portions 19h. The opening areas in the narrowest portion of the second pad exposure portions 19h (the areas of the cross-sections parallel to the top surface of the cover 9, i.e., the areas of the portions which are cut away the narrowest in the cut away portions) are larger than the opening areas of the broadest portions of the first pad exposure portions 17h.

Accordingly, in the pad exposure portions 9h, overall, roughly, the top surface 9a sides become broader than the bottom surface 9b sides, therefore effects the same as the effects by the inclined surfaces explained above can be expected. That is, it is expected that, between the inner surfaces of the pad exposure portions 9h and the bumps 57, flow of the mold resin 59 from the top surface 9a side to the bottom surface 9b side in the cover 9 will become easier, that making the diameters of the pad exposure portions 9h smaller while securing the distance between the inner circumferential surfaces of the pad exposure portions 9h and the bumps 57 will become easier, etc.

The pad exposure portion 9h is communicated with the outside of the side surface of the lid section 19. Accordingly, as indicated by an arrow y3 in FIG. 6C, the mold resin 59 not only flows from the top surface 9a of the cover 9 into the pad exposure portions 9h, but also flows from the side surface of the cover 9 into the pad exposure portions 9h. That is, flow of the mold resin 59 to the pad exposure portions 9h becomes easier. As a result, formation of voids in the mold resin 59 is suppressed. Further, from another viewpoint, the formation of the pad exposure portions 9h inside so as not to project to the outside of the side surfaces of the cover 9 becomes unnecessary, therefore the pads 7 can be placed nearer the outside of the cover 9. As a result, a large vibration space 21 can be secured or the SAW device 1 can be reduced in size.

<Second Embodiment>

Figure 7:
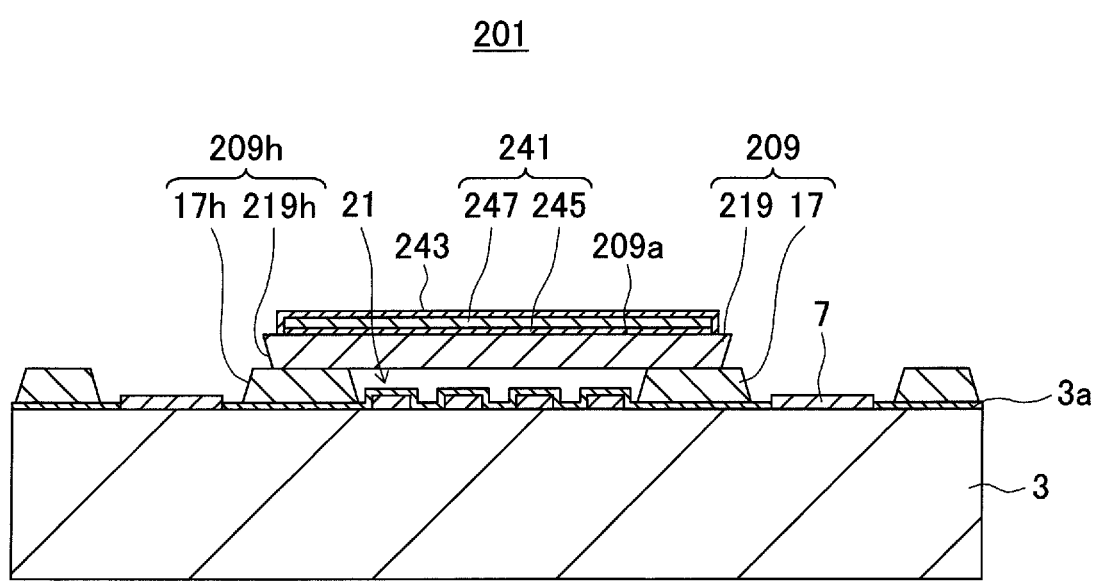
FIG. 7 A cross-sectional view which shows a SAW device of a second embodiment.

FIG. 7 is a cross-sectional view which shows a SAW device 201 of a second embodiment and corresponds to FIG. 6A.

In the SAW device 201, inner circumferential surfaces of second pad exposure portions 219h are, opposite to the inner surfaces of the second pad exposure portions 19h in the first embodiment, configured by inclined surfaces which are inclined in a direction such that the second pad exposure portions 219h become narrower the closer to a top surface 209a side of a cover 209. Note that, the opening areas in the narrowest portions of the second pad exposure portions 219h (in the present embodiment, the portions on the top surface 9a side of the cover 9) are larger than the opening areas of the broadest portions of the first pad exposure portions 17h in the same way as the first embodiment.

Further, the SAW device 201 has a reinforcing layer 241 which is superimposed on the top surface 9a of the cover 9 and an insulation layer 243 which covers the reinforcing layer 241.

The reinforcing layer 241 is for reinforcing the strength of the cover 209 (particularly the lid section 219). The reinforcing layer 241 is formed over a relatively broad range of the cover 209. For example, the reinforcing layer 241 avoids the position of arrangement of the pad exposure portions 209h and is formed over roughly the entire surface of the top surface 209a. Accordingly, in a plan view, the reinforcing layer 241 covers roughly the entire vibration space 21, extends to the outside of the vibration space 21, and is supported upon the frame section 17 together with the lid section 219.

The reinforcing layer 241 is configured by a material having a higher Young's modulus than that of the material for the cover 209. For example, in contrast to the cover 209 being formed by a resin having a Young's modulus of 0.5 to 1 GPa, the reinforcing layer 241 is formed by a metal having a Young's modulus of 100 to 250 GPa. The thickness of the reinforcing layer 241 is for example 1 to 50 μm.

The reinforcing layer 241 has for example a base layer 245 which is superimposed on the top surface 209a of the cover 209 and a metal portion 247 which is superimposed on the base layer 245. The base layer 245 is formed by for example copper, titanium, or a laminate of these. The thickness of the base layer 245 is for example 300 nm to 1 μm when the base layer 245 is made of copper and 10 nm to 100 nm when the base layer 245 is made of titanium. The metal portion 247 is formed by for example copper.

The insulation layer 243 is for insulating the reinforcing layer 241 such as suppressing contact between the reinforcing layer 241 and the bumps 57. The insulation layer 243 covers the top surface and side surface of the reinforcing layer 241 as a whole. The insulation layer 243 is formed by for example a resin.

FIG. 8A to FIG. 8D are cross-sectional views which explain the method of production of the SAW device 201 and correspond to FIG. 7.

In the method of production of the SAW device 201 as well, in the same way as the first embodiment, the processes of FIG. 5A to FIG. 6A are carried out. Note, in the formation of the lid section 219, second pad exposure portions 219h which become broader the closer to the top surface 209a side of the cover 209 are formed by making the material of the cover 209 (lid section 219), the conditions of the photolithography (positive type/negative type, exposure value, etc.), and the conditions of etching (composition ratio of etching gas, application voltage, etching time, etc.) different from those in the first embodiment.

For example, when the lid section 219 is formed by a negative type photosensitive resin, a cross-connecting reaction of the photosensitive resin is apt to advance more the closer to the top surface side of the lid section 219, and the cross-connecting reaction of the photosensitive resin is apt to advance more slowly the closer to the bottom surface side, therefore the second pad exposure portions 219h tend to become broader the closer to the bottom surface side. Note, it is also possible to make hole portions narrower the closer to the bottom surface side by the negative type photosensitive resin by changing other conditions.

Figure 8A:
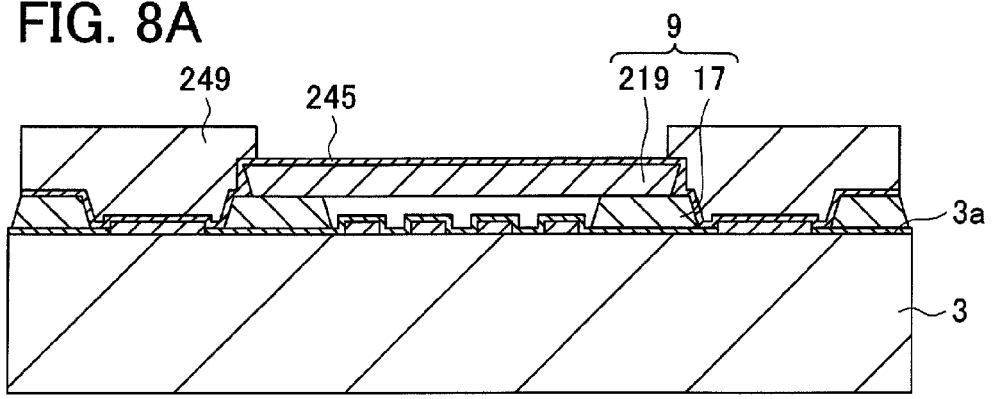
FIG. 8A to FIG. 8D are cross-sectional views for explaining a method of production of the electronic component in FIG. 7.

When the cover 209 is formed, as shown in FIG. 8A, a thin film which becomes the base layer 245 is formed and further a resist layer 249 is formed on that. The thin film which becomes the base layer 245 is formed over the entire first primary surface 3a side of the element substrate 3. The base layer 245 is formed by for example the sputtering method.

The resist layer 249 is formed so that the base layer 245 is exposed in a range where arrangement of the reinforcing layer 241 is planned. The resist layer 249 is for example formed by forming a thin film of photosensitive resin by spin coating or the like, and patterning the thin film by photolithography.

Figure 8B:
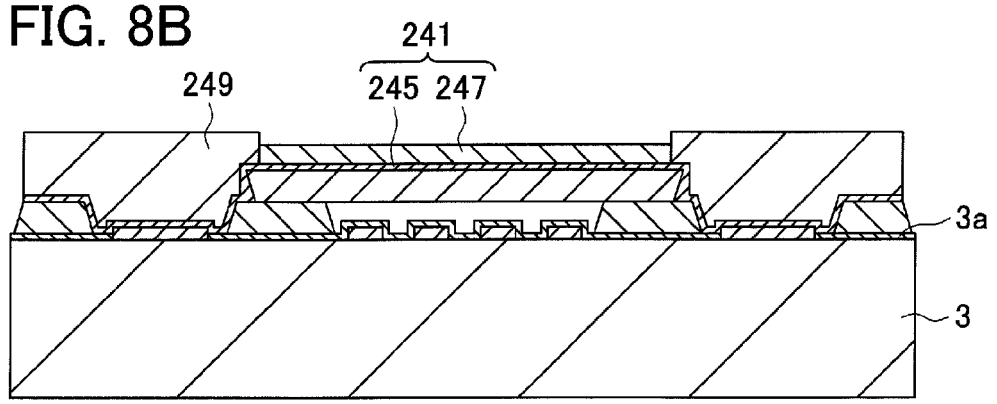

When the resist layer 249 is formed, as shown in FIG. 8B, electroplating treatment is used to deposit a metal at the exposed portions of the base layer 245. Due to this, metal portions 247 having a desired thickness are formed on the top surface 9a of the cover 9.

Figure 8C:
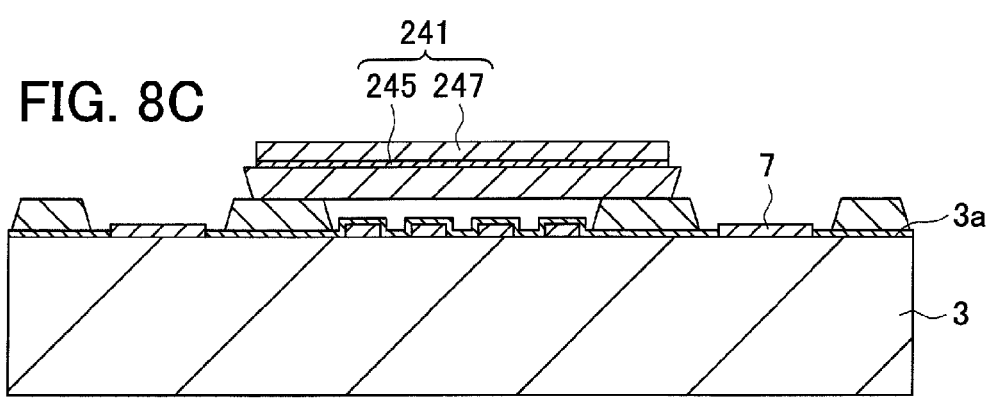

When the metal portions 247 are deposited, as shown in FIG. 8C, the portions of the base layer 245 which were covered by the resist layer 249 and the resist layer 249 are removed. Due to this, the reinforcing layer 241 which is configured by the base layer 245 and the metal portions 247 is formed. Note that, in the pad 7, for example by covering the surface by gold, roughening by a chemical solution for removing the unnecessary portions of the base layer 245 is suppressed.

Figure 8D:
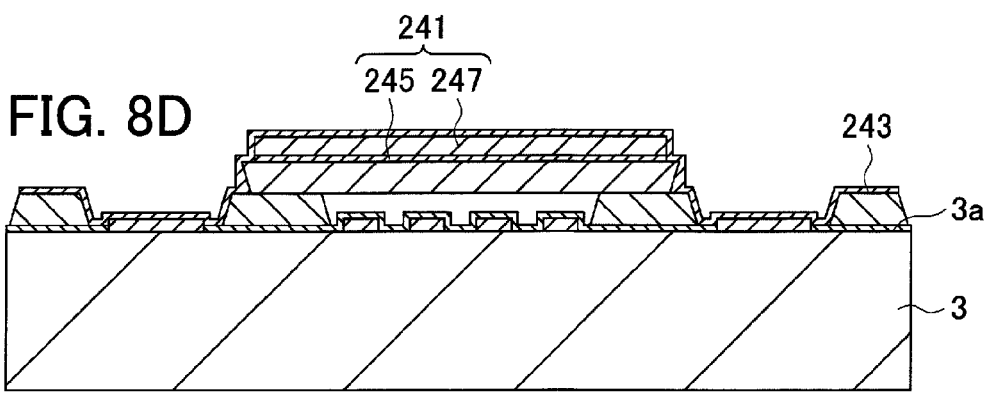

When the reinforcing layer 241 is formed, as shown in FIG. 8D, a thin film which becomes the insulation layer 243 is formed on the entire surface on the first primary surface 3a side of the element substrate 3. The thin film which becomes the insulation layer 243 is formed by for example the spin coating method or spraying method. Note that, immediately after coating the material which becomes the insulation layer 243 by the spin coating method, a state where that material is filled up to the height of the metal portion 247 is exhibited. After that, this thin film is patterned by photolithography or the like, and the insulation layer 243 is formed as shown in FIG. 7.

According to the above second embodiment, although not particularly shown, in the same way as the first embodiment, the SAW device 1 can make the top surface 209a of the cover 209 face the mounting surface 53a, make the bumps 57 be located in the pad exposure portions 209h, and make the pads 7 abut against the bumps 57. Then, the mold resin 57 can be filled between the top surface 209a of the cover 209 and the mounting surface 53a and between the bumps 57 and the inner circumferential surfaces of the pad exposure portions 209h. Accordingly, in the same way as the first embodiment, the degree of freedom of the shape of the bumps 57 is improved.

The inner surfaces of the pad exposure portions 209h have inclined surfaces (inner surfaces of the second pad exposure portions 219h) which are inclined in a direction such that the pad exposure portions 209h become narrower the closer to the top surface 209a side of the cover 209 and contact the mold resin 59.

Accordingly, for example, the mold resin 59 filled between the inclined surfaces and the bumps 57 can be engaged with the cover 209 in the direction preventing separation of the cover 209 from the mounting surface 53a. As a result, separation of the bumps 57 and the pads 7 is suppressed, so improvement of the reliability of the SAW device 201 can be expected.

The cover 209 has the frame section 17 which is located on the first primary surface 3a of the element substrate 3 and surrounds the excitation electrodes 5, and the lid section 219 which is superimposed on the frame section 17 and closes the openings of the frame section 17. The SAW device 201 has the reinforcing layer 241 which is superimposed on the top surface 209a of the cover 209 and is superimposed on the openings of the frame section 17 in a plan view and is made of a material having a higher Young's modulus than that of the cover 209. The inner surfaces of the pad exposure portions 209h have, in the portions penetrating through the lid section 219, inclined surfaces (inner circumferential surfaces of the second pad exposure portions 219h) which are inclined a direction such that they become narrower the closer to the top surface 209a side of the cover 209.

Accordingly, the pad exposure portions 209h can be made larger to suppress contact of the bumps 57 with the inner surfaces of the pad exposure portions 209h while securing a broader area of the top surface 209a of the cover 209 and consequently space for arrangement of the reinforcing layer 241 can be secured. As a result, a small-sized and high strength SAW device 201 is realized.

<Third Embodiment>

Figure 9:
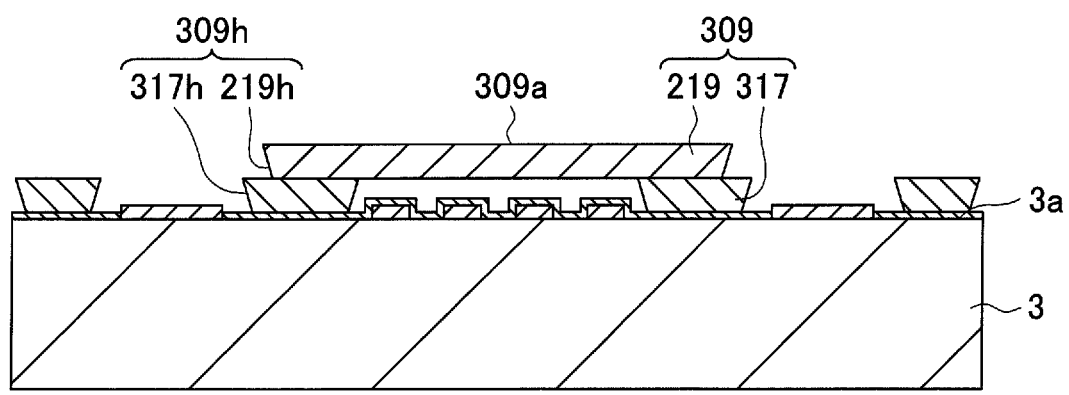
FIG. 9 A cross-sectional view which shows a SAW device of a third embodiment.

FIG. 9 is a cross-sectional view which shows a SAW device 301 of a third embodiment and corresponds to FIG. 6A.

In the SAW device 301, opposite to the inner circumferential surfaces of the first pad exposure portions 17h in the first embodiment, inner circumferential surfaces of first pad exposure portions 317h are configured by inclined surfaces which are inclined in a direction such that the first pad exposure portions 317h (pad exposure portions 309h) become narrower the closer to a top surface 309a side of a cover 309. Note that, the second pad exposure portions 217h of the SAW device 301 are the same as the second pad exposure portions 217h of the SAW device 201 in the second embodiment. Further, the opening areas in the narrowest portions of the second pad exposure portions 219h (in the present embodiment, the portions on the top surface 309a side of the cover 309) are larger than the opening areas of the broadest portions of the first pad exposure portions 317h (in the present embodiment, the portions on the bottom surface 309b side of the cover 309) in the same way as the first and second embodiments.

According to the present embodiment, for example, the frame section 317 can be engaged with the mold resin 59 in the same way as the lid section 219, and it is possible to further suppress separation of the cover 309 from the mounting surface 53a of the mounting board 53.

<Fourth Embodiment>

Figure 10:
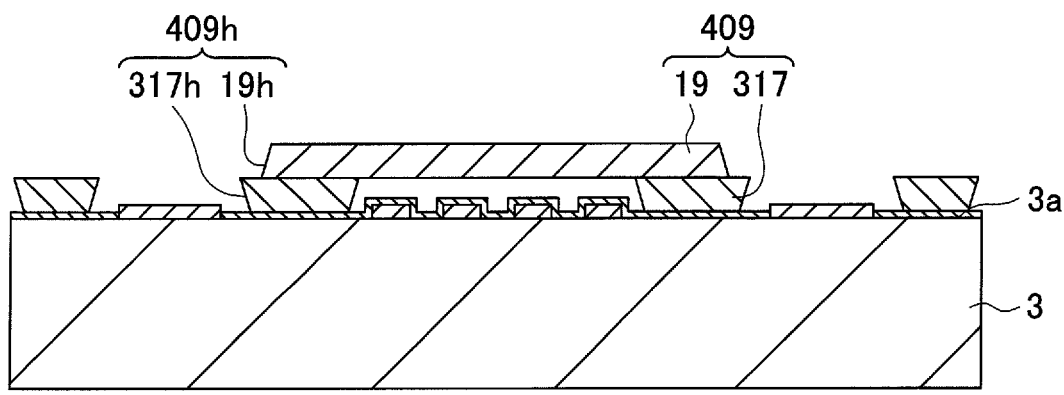
FIG. 10 A cross-sectional view which shows a SAW device of a fourth embodiment.

FIG. 10 is a cross-sectional view which shows a SAW device 401 of a fourth embodiment and corresponds to FIG. 6A.

A cover 409 of the SAW device 401 has the frame section 317 of the third embodiment and the lid section 19 of the first embodiment. That is, a pad exposure portion 409h has the first pad exposure portions 317h of the third embodiment and the second pad exposure portions 19h of the first embodiment. Note that, the opening areas in the narrowest portions of the second pad exposure portions 19h (in the present embodiment, the portions on the frame section 317 side) are larger than the opening areas of the broadest portions of the first pad exposure portions 317h (in the present embodiment, the portions on the bottom surface 309b side of the cover 309) in the same way as the first to third embodiments.

According to the present embodiment, for example, filling of the mold resin 59 can be facilitated by the second pad exposure portion 19h while the frame section 317 can be engaged with the mold resin 59.

<Fifth Embodiment>

Figure 11:
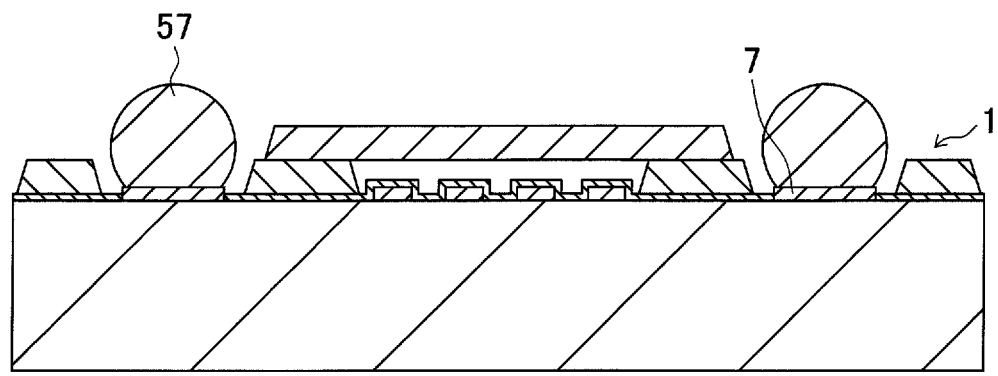
FIG. 11 A cross-sectional view which shows a SAW device of a fifth embodiment.

FIG. 11 is a cross-sectional view which shows a SAW device 501 of a fifth embodiment and corresponds to FIG. 6A.

The SAW device 501 has the SAW device 1 of the first embodiment and bumps 57 which are arranged on the pads 7 of the SAW device 1. The bumps 57 are the same as those arranged on the pads 55 of the mounting board 53 in the first embodiment and are separated from the inner circumferential surfaces of the pad exposure portions 9h.

In this way, the bumps 57 may be provided not on the mounting board 53, but in the SAW device 501. Even in this case, an electronic component 51 the same as that in the first embodiment is configured by the SAW device 501, and the same effects as those by the first embodiment are exhibited.

<Sixth Embodiment>

Figure 12:
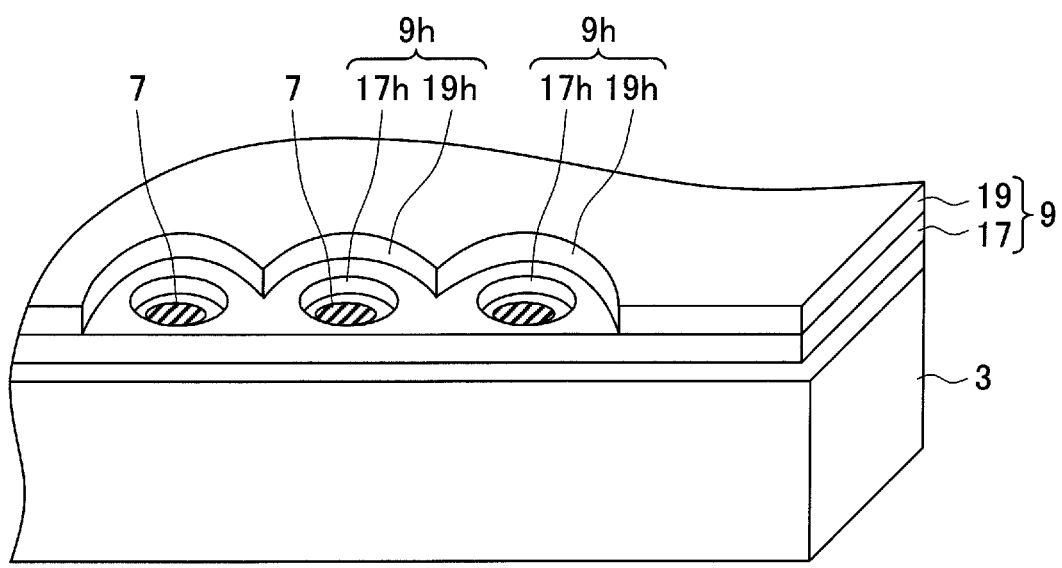
FIG. 12 A perspective view which shows a portion of a SAW device of a sixth embodiment.

FIG. 12 is a perspective view which shows a portion of a SAW device 601 of a sixth embodiment.

In the SAW device 601, at part of the plurality of pad exposure portions 9h, the pad exposure portions 9h are connected with each other at the top surface side portion of the cover 9. Specifically, the pad exposure portions 9h are connected with each other through spaces formed in the lid section 19. In other words, the second pad exposure portions 19h are connected with each other, but the first pad exposure portions 17h are independent from each other. The mutual connection of the second pad exposure portions 19h is for example carried out by arrangement of the pad exposure portions 9h close to each other so that the distances between the centers of the second pad exposure portions 19h become shorter than the diameters of the second pad exposure portions 19h.

According to the present embodiment, the mold resin 59 flows between the pad exposure portions 9h as well. Therefore, for example, the mold resin 59 can be supplied to pad exposure portions 9h at positions to which the mold resin 59 is hard to flow by going through other pad exposure portions 9h. Further, it becomes possible to arrange the pads 7 adjacent to each other, therefore the SAW device is made smaller in size.

<Seventh Embodiment>

Figure 13:
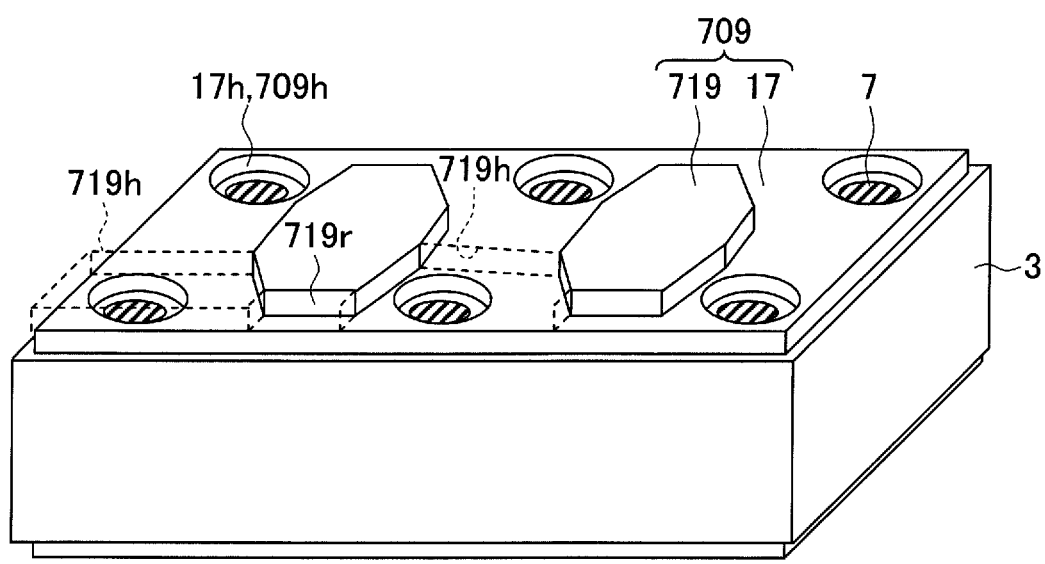
FIG. 13 A perspective view which shows a SAW device of a seventh embodiment.

FIG. 13 is a perspective view which shows a SAW device 701 of a seventh embodiment.

The lid section 719 of the SAW device 701 is provided at only the portion covering the vibration space 21 (see FIG. 2). For example, the lid section 719 is given a roughly similar shape as that of the vibration space 21 and is superimposed on the frame section 17 with a roughly constant width on its periphery. Further, pad exposure portions 709h of a cover 709 are configured by only the first pad exposure portions 17h. Note, it can be grasped too that the pad exposure portions 709h are configured by the first pad exposure portions 17h and the second pad exposure portions 719h indicated by a dotted line, and the second pad exposure portions 719h are connected with each other through groove sections 719r formed in the lid section 719.

According to the present embodiment, flow of the mold resin 59 to the clearances between the pad exposure portions 709h and the bumps 57 becomes easier. Further, the lid section 719 is given a necessary minimum size, therefore possibility of contact between the bumps 57 and the lid section 719 can be reduced and consequently reduction of size of the SAW device 1 can be expected as well.

Note that, in the first embodiment, compared with the present embodiment, the contact area between the lid section 19 and the frame section 17 is large, and the peel strength of the lid section 19 from the frame section 17 is high. As a result, for example, in the case where the lid section 19 is formed by adhesion of film, when peeling off the base film 31 of that film (see FIG. 5C), the chance of the thin film which becomes the lid section 19 peeling off from the frame section 17 is reduced.

<Eighth Embodiment>

FIG. 14 is a plan view which shows a SAW device 801 of an eighth embodiment. Note that, in the figure, the vibration space 21 is indicated by the broken lines, and the portions at which the frame section 17 and the lid section 19 are superimposed on each other are hatched. Further, in the SAW device 801, portions of the lines 15 (connection portions with the pads 7) are exposed from the cover 9, but the lines 15 exposed from the cover 9 are omitted in FIG. 14.

All of embodiments explained above showed examples in which the first pad exposure portions 17h were configured by hole portions, but in the SAW device 801, the first pad exposure portions 17h are formed by cut away portions. Further, in the SAW device 801, the second pad exposure portions 19h are formed by cut away portions as well. That is, the pad exposure portions 9h are configured by cut away portions. When the pad exposure portions 9h are formed by only cut away portions in this way, the cover 9 no longer has portions which circle around to the outsides of the pads 7, so the SAW device 801 can be reduced in size by that amount.

Further, in the SAW device 601 in the sixth embodiment explained above, an example in which the second pad exposure portions 19h were connected with each other and the first pad exposure portions 17h were independent from each other in part of the plurality of pad exposure portions 9h was shown. However, in the SAW device 801, in part of the plurality of pad exposure portions 9h, not only the second pad exposure portions 19h, but also the first pad exposure portions 17h are connected with each other.

Further, in the SAW device 801, markers 23 are provided at three corners among the four corners of the first primary surface 3a of the element substrate 3. These markers 23 are used for positioning when mounting the SAW device 801 on the mounting board 53 or the like. Specifically, by the three markers, the position etc. in the xy direction of the SAW device 801 is recognized. The position of the SAW device 801 is adjusted based on that so that the pads 7 are located on pads 55 on the mounting board 53 side which correspond to the former pads. The markers 23 are for example formed by using the same material as that for the pads 7 and by the same process as that for the pads 7.

From the viewpoint of reduction of size of the SAW device, it is preferable that the frame section 17 is made as small as possible. On the other hand, the frame section 17 is a portion which becomes a support when forming the lid section 19. Therefore, if that is made too small, inconveniences such as distortion of the shape of the lid section 19 when forming the lid section 19 become easier to happen. Therefore, in the SAW device 801, projections 17p are provided so that the frame section 17 is located between the adjacent pads 7 as well. Due to this, the inconvenience when forming the lid section 17 can be eliminated by securing the area of the frame section 17 while reducing the size of the SAW device.

The projections 17p are made to project more outward than the lid section 19. In other words, in portions where the projections 17p are provided, the outer periphery of the lid section 19 is located on the inner side from the outer periphery of the projections 17p. The fact that at the portions of the frame section 17 where the projections 17p are provided, if providing the same projections at the lid section 19 as well and the outer peripheries of the frame section 17 and the lid section 19 are located in the same plane, the cover 9 becomes easier to peel off from the element substrate 3 from the portions where the projections 17b are provided as the starting points has been confirmed by the inventors of the present application. It is guessed that this occurs due to the action of shrinkage stress of the lid section 19 upon the portions in the frame section 17 where the projections 17b are formed when the lid section 19 made of resin contracts due to a change of temperature.

Therefore, by forming the lid section 19 so that the outer periphery of the lid section 19 is located on inner side from the outer periphery of the projections 17p at the portions where the projections 17p are provided, peeling of the cover 9 from the element substrate 3 can be suppressed. A projection amount "d" of the projections 17p when using the outer periphery of the lid section 19 as the standard is preferably 20 µm or more, more preferably 36 µm or more. It can be considered too from this that the lid section 19 should be made as small as possible so that its outer periphery separates from the projections 17p of the frame section 17. However, if the lid section 19 is made too small, a tendency is seen for cracks to easily occur in the frame section 17 on the short sides of the element substrate 3 this time.

The cause for this is not definite. However, as one factor, it is considered that a large stress is apt to be applied on the short sides of the element substrate 3 where the element substrate 3 warps, therefore a shrinkage stress of the lid section 19 is added to that portion, and cracks occur from the edge of the lid section 19 as the starting point. Such cracks of the frame section 17 can be suppressed by setting the superimposed width "w" of the frame section 17 and the lid section 19 on the short sides of the element substrate 3 to 80 µm or more.

Further, in the SAW device 801, the frame section 17 and the lid section 19 have a first edge portion 17s and a second edge portion 19s having rounded shapes. As shown in the enlarged view of FIG. 14B, the outer periphery of the second edge portion 19s is located on the inner side from the outer periphery of the first edge portion 17s, and its curvature radius is made larger than the curvature radius of the first edge portion 17s. Even in such an edge portion, there is a tendency that the cover 9 is apt to peel from the element substrate 3. However, by making the outer periphery of the second edge portion 19s located on the inner side from the outer periphery of the first edge portion 17s and setting its curvature radius larger than the curvature radius of the first edge portion 17s, occurrence of peeling of the frame section 17 from the element substrate 3 in this portion can be suppressed.

EXAMPLES

Figure 14A:
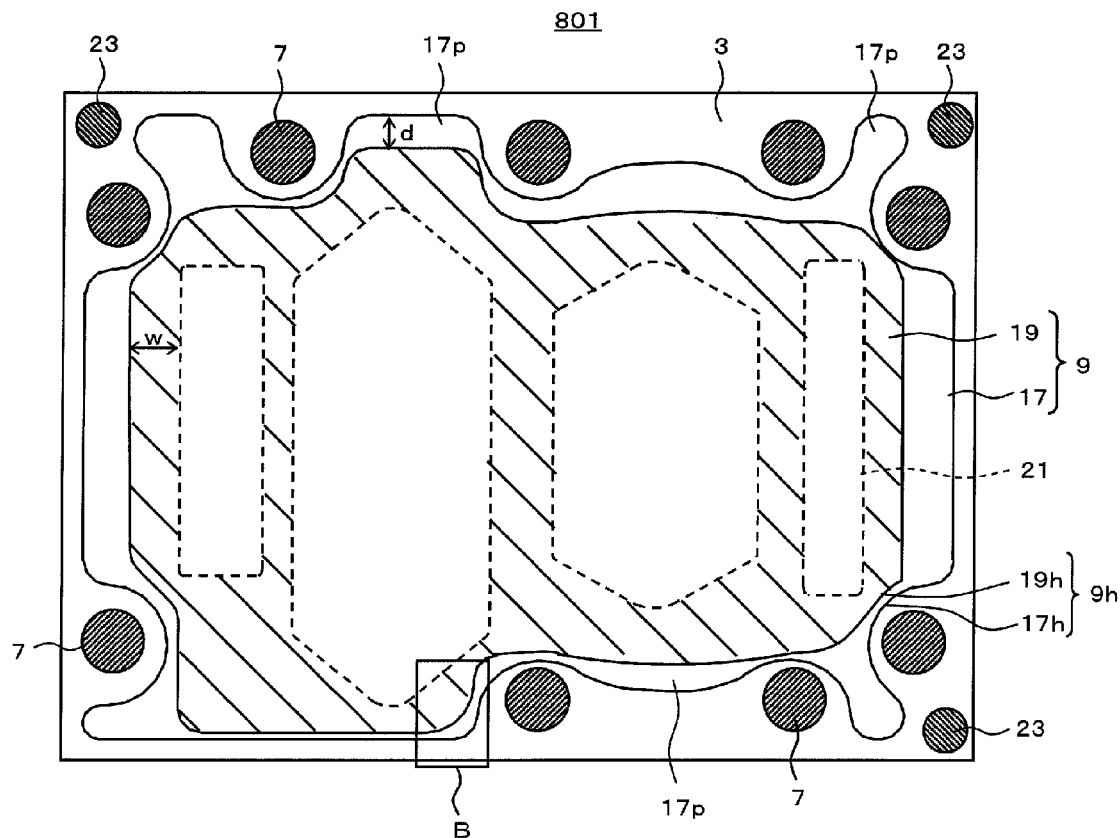
FIG. 14A is a plan view which shows a SAW device of an eighth embodiment.
Figure 14B:
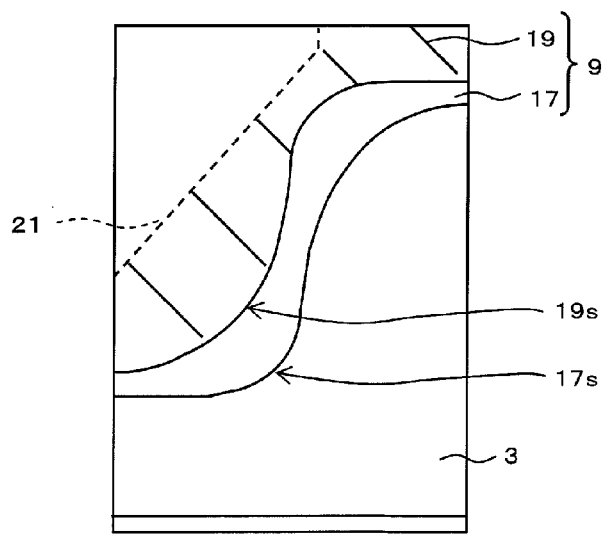
FIG. 14B is an enlarged view of a region B in FIG. 14A.

A SAW device 801 shown in FIG. 14A was prepared and a temperature cycle test was carried out to thereby check for the presence of cracks in the frame section 17. The temperature cycle test was carried out by allowing the SAW device to stand at −40° C. for 30 minutes and then allowing it to stand at 80° C. for 30 minutes as one cycle and repeating this for 100 cycles. The element substrate 3 was made of a lithium tantalate single crystal, had a thickness of 0.2 mm, and had planar dimensions of 1.82 mm×1.32 mm. Further, epoxy acrylate was used for the cover 9, and both of the frame section 17 and the lid section 19 were given a thickness of 30 µm.

Under these conditions, 22 devices in which the superimposing width "w" of the frame section 17 and the lid section 19 was set to 40 µm (Example 1) and 22 devices in which the superimposing width "w" was set to 80 µm (Example 2) were prepared, and it was checked whether cracks were formed in the frame section 17 on the short sides of the element substrate 3. Note that, formation of crack was checked for visually.

After the temperature cycle test, when comparing the rate of occurrence of cracks in the SAW devices of Example 1 and the rate of occurrence of crack in the SAW devices of Example 2, the rate of occurrence of cracks in the SAW devices of Example 2 was remarkably reduced from the rate of occurrence of cracks in the SAW device of Example 1. Note that, the rate of occurrence of cracks in the SAW devices of Example 2 was zero. It could be confirmed from this that generation of cracks in the frame section 17 can be effectively suppressed by setting the superimposing width "w" of the frame section 17 and the lid section 19 on the short sides of the element substrate 3 to 80 µm or more.

The present invention is not limited to the above embodiments, and can be executed in various ways.

The embodiments explained above can be suitably combined. For example, the reinforcing layer 241 (FIG. 7) in the second embodiment may be provided in all of the other embodiments as well. In the fifth to seventh embodiments (FIG. 11 to FIG. 13), the combination of inclined surfaces of the first pad exposure portions or second pad exposure portions is not limited to the combination of inclined surfaces in the first embodiment and may be the combination of inclined surfaces in the second to fourth embodiments (FIG. 7, FIG. 9, and FIG. 10) as well.

The acoustic wave device is not limited to a SAW device. For example, the acoustic wave device may be a piezoelectric thin film resonator or may be an elastic boundary wave device (note, included in a SAW device in a broad sense). Note that, in the elastic boundary wave device, the gap (vibration space) above the excitation electrodes is unnecessary. In other words, the cover does not have to have a frame section and a lid section having planar shapes different from each other, but may be formed by only one layer. Further, in the elastic boundary wave device, the protective layer can be also used for the cover and vice versa.

Further, in the acoustic wave device, the protective layer and back surface portion are not essential factors and may be omitted as well. Further, in the case where the reinforcing layer is provided in the acoustic wave device, the insulation layer covering the reinforcing layer is not an essential factor and may be omitted as well. Conversely, in the acoustic wave device, a conductive layer located between the frame section and the lid section, an insulation film covering the top surface and side surface of the cover, and another suitable layer may be added as well.

In the pad exposure portions (9h etc.) of the cover, the inner surfaces need not have inclined surfaces and the opening areas on the top surface side of the cover need not be larger than the opening areas on the bottom surface side of the cover. For example, the pad exposure portions may be formed by hole portions having a constant opening area through the cover from the bottom surface to the top surface or may be configured by first pad exposure portions comprised of hole portions formed with a constant opening area and second pad exposure portions comprised of hole portions having an opening area larger or smaller than the hole portions of the first pad exposure portions. Further, they may be configured by first or second pad exposure portions comprised of hole portions formed with a constant opening area and second or first pad exposure portions having inner surfaces inclined as well.

The form of the cut away portions by which the pad exposure portions of the cover are communicated with the outside of the side surfaces of the cover is not limited to a form where the pad exposure portions protrude at the side surfaces of the cover, and mutual connection of the pad exposure portions is not limited to connection where the pad exposure portions are superimposed on each other. For example, groove portions connecting the pad exposure portions and the side surfaces of the cover may be formed in the cover or groove portions connecting the pad exposure portions with each other may be formed in the cover. The form of connecting the pad exposure portions with the outside of the side surfaces of the cover or the form of connecting the pad exposure portions with each other is not limited to one wherein connection is carried out in only the top surface side portion of the cover (for example only the lid section) or through the cover from the top surface to the bottom surface. For example, the pad exposure portions may be connected with each other in only the portion on the bottom surface side of the cover (for example only the frame section) as well.

Between the pad exposure portions of the cover and the bumps, the mold resin is preferably filled through the cover from the top surface to the bottom surface. Note, the mold resin may be filled while separating the inner circumferential surfaces of the pad exposure portions and the bumps at only part of the positions where cracks are apt to occur in the bumps (for example edge portions formed by the pad exposure portions and the top surface of the cover) or the like.

In the case where the pad exposure portions are communicated with the outside of the side surfaces of the cover, the top surface of the cover may abut against the mounting surface of the mounting board as well. That is, the mold resin need not be filled between the top surface of the cover and the mounting surface. Even when the top surface of the cover abuts against the mounting surface, the mold resin flows in from the outside of the side surfaces of the cover to the pad exposure portions, therefore formation of voids around the bumps is suppressed.

The bumps are not limited to metal which is melted by heating and is not limited to solder. For example, the bumps may be configured by a conductive binder which is solidified by heating as well. Further, the shape of the bumps need not be semi-spherical before mounting of the acoustic wave device either. For example, the acoustic wave device may be placed on the mounting board in a state where the bumps are solder pastes (state before they are shaped to semi-spherical shapes) and reflow carried out. Further, the shape of the bumps after bonding the acoustic wave device and the mounting board is not limited to the spherical shape either. According to the size of the pads, amount of bumps, wettability of the material of the bumps, and so on, the outer circumferential surfaces of the bumps form a concave shape.

The method of production of the acoustic wave device is not limited to those exemplified in the embodiments. For example, a cover which does not need a vibration space does not have to be separately formed from a frame section and a lid section: The entire cover may be integrally formed by one photolithographic operation or the like. Further, for example, a cover needing a vibration space may be formed by forming a sacrificing layer in a region which becomes the vibration space, then forming a resin layer which becomes the cover on the sacrificing layer, then melting the sacrificing layer and make it flow out from the inside of the resin layer.

REFERENCE SIGNS LIST

1 . . . SAW device (acoustic wave device), 3 . . . element substrate, 3a . . . first primary surface, 5 . . . excitation electrode, 7 . . . pad, 9 . . . cover, 9a . . . top surface, 9h . . . pad exposure portion, 51 . . . electronic component, 53 . . . mounting board, 57 . . . bump, and 59 . . . mold resin.

The invention claimed is:

1. An electronic component, comprising
a mounting board,
a bump which is located on a mounting surface of the mounting board, and
an acoustic wave device which is located on the bump and is connected to the bump,
wherein the acoustic wave device comprises
an element substrate,
an excitation electrode which is located on a primary surface of the element substrate,
a pad with a flat, planar shape, which is located on the primary surface and is connected to the excitation electrode, and
a cover which is located above the excitation electrode to cover the excitation electrode and which is formed with a pad exposure portion exposing the pad and comprised of a hole portion or a cut away portion or a combination of the same,
wherein
the top surface of the cover is made to face the mounting surface,
the bump is located in the pad exposure portion and is apart from the cover,
in the bump, a surface in the mounting board side is nearer to the mounting surface than the top surface of the cover, and
the pad is directly contacted to the bump.

2. The electronic component according to claim 1, further comprising a mold resin covering the acoustic wave device, wherein the mold resin is filled between the top surface of the cover and the mounting surface, and between the bump and an inner circumferential surface of the pad exposure portion.

3. The electronic component according to claim 2, wherein
the cover comprises
a ring shaped frame section which is located on the primary surface of the element substrate and surrounds the excitation electrode, and
a lid section which is superimposed on the frame section and closes the frame section, the pad exposure portion comprises
a first pad exposure portion which is formed in the frame section and is comprised of a hole portion or a cut away portion, and
a second pad exposure portion which is formed in the lid section so as to be communicated with the first pad exposure portion part and is comprised of a hole portion or a cut away portion, and
at least one of an inner surface of the first pad exposure portion and an inner surface of the second pad exposure portion is inclined in a direction whereby it becomes broader the closer to the top surface side of the cover.

4. The electronic component according to claim 2, wherein
the cover comprises
a ring shaped frame section which is located on the primary surface of the element substrate and surrounds the excitation electrode, and
a lid section which is superimposed on the frame section and closes the frame section, the pad exposure portion comprises
a first pad exposure portion which is formed in the frame section and is comprised of a hole portion or a cut away portion, and
a second pad exposure portion which is formed in the lid section so as to be communicated with the first pad exposure portion and is comprised of a hole portion or a cut away portion, and
at least one of the inner surface of the first pad exposure portion and the inner surface of the second pad exposure portion is inclined in a direction whereby it becomes narrower the closer to the top surface side of the cover.

5. The electronic component according to claim 4, wherein
the inner surface of the second pad exposure portion is inclined in a direction whereby it becomes narrower than the closer to the top surface side of the cover, and
the acoustic wave device further comprises a reinforcing layer which is superimposed on the top surface of the cover, superimposed on the inner side of the frame section in a plan view and is made of a material having a higher Young's modulus than that of the cover.

6. The electronic component according to claim 2, wherein
the cover comprises
a ring shaped frame section which is located on the primary surface of the element substrate and surrounds the excitation electrode, and
a lid section which is superimposed on the frame section and closes the frame section,
the pad exposure portion comprises
a first pad exposure portion which is formed in the frame section and is comprised of a hole portion or a cut away portion, and
a second pad exposure portion which is formed in the lid section so as to be communicated with the first pad exposure portion and is comprised of a hole portion or a cut away portion,
the inner surface of the first pad exposure portion is inclined in a direction whereby it becomes broader the closer to the top surface side of the cover, and
the inner surface of the second pad exposure portion is inclined in a direction whereby it becomes narrower the closer to the top surface side of the cover.

7. The electronic component according to claim 3, wherein the mold resin is filled from the first pad exposure portion up to the second pad exposure portion, and an opening area in the narrowest portion of the second pad exposure portion is larger than an opening area in the broadest portion of the first pad exposure portion.

8. The electronic component according to claim 3, wherein the second pad exposure portion is comprised of a notch which is communicated with the outside of a side surface of the cover.

9. The electronic component according to claim 1, wherein a plurality of the pad exposure portions are provided in a plan view of the top surface of the cover, and at least portion of the pad exposure portions among the plurality of pad exposure portions are connected with each other in the portion on the top surface side of the cover.

10. The acoustic wave device according to claim 3, wherein the top surface of the cover comprises a step configured by making an outer periphery of the lid section smaller than an outer periphery of the frame section in a plan view.

11. The electronic component according to claim 1, wherein the cover includes a frame section, a lid section, and a lower surface, the pad is thinner than a distance between the primary surface of the element substrate and the lower surface of the cover at a position of the excitation electrode, and the acoustic wave device includes a vibration space formed by the primary surface, the frame section, and the lid section, the vibration space facilitating the vibration of the excitation electrode.

12. The electronic component according to claim 1, wherein the pad is thinner than the bump.

13. An acoustic wave device, comprising
an element substrate,
an excitation electrode which is located on a primary surface of the element substrate,
a pad which is located on the primary surface and is connected to the excitation electrode, and
a cover which is located above the excitation electrode, which is formed with pad exposure portion exposing the pad and comprised of a hole portion or a cut away portion or a combination of the same,
wherein
the cover comprises
a ring-shaped frame section which is located on the primary surface of the element substrate and surrounds the excitation electrode, and
a lid section which is superimposed on the frame section and closes the frame section,
the pad exposure portion comprises
a first pad exposure portion which is formed in the frame section and is comprised of a hole portion, and
a second pad exposure portion located around the first pad exposure portion in a plan view, which is formed in the lid section so as to be communicated with the first pad exposure portion, and which is comprised of a cut away portion having a circumference disconnected on a part of a lateral side portion of the frame section.

14. The acoustic wave device according to claim 13, wherein the frame section comprises a projection which projecting outward from the outer periphery of the lid section in a plan view.

15. The acoustic wave device according to claim 13, wherein
the frame section comprises a first edge portion in its outer peripheral edge, the first edge portion being a rounded edge portion in a plan view,
the lid section comprises a second edge portion in its outer peripheral edge, the second edge portion being located diagonally upward from the first edge portion and being a rounded edge portion in a plan view, and,
in a plan view, the outer periphery of the second corner portion is located on an inner side from the outer periphery of the first corner portion, and a curvature radius of the second corner portion is larger than a curvature radius of the first corner portion.

16. An acoustic wave device, comprising
an element substrate,
an excitation electrode which is located on a primary surface of the element substrate,
a plurality of pads which are located on the primary surface and are connected to the excitation electrode, and
a cover which is located above the excitation electrode and which is formed with pad exposure portions exposing the plurality of pads and comprised of hole portions or cut away portions or combinations of the same,
wherein
the cover comprises
a ring-shaped frame section which is located on the primary surface of the element substrate and surrounds the excitation electrode, and
a lid section which is superimposed on the frame section and closes the frame section,
each of the plurality of pad exposure portions comprises
a first pad exposure portion which is formed in the frame section and is comprised of a hole portion,
a second pad exposure portion, which is formed in the lid section so as to be communicated with the first pad exposure portion, and which is comprised of a cut away portion having a circumference disconnected on a part of a lateral side portion of the frame section, and
at least a portion of the plurality of pad exposure portions are connected with each other in a plan view.

* * * * *